US00RE42980E

(19) United States
(12) Reissued Patent
Kröninger et al.

(10) Patent Number: US RE42,980 E
(45) Date of Reissued Patent: Nov. 29, 2011

(54) METHOD FOR APPLYING A RESIST LAYER, USES OF ADHESIVE MATERIALS, AND ADHESIVE MATERIALS AND RESIST LAYER

(75) Inventors: Werner Kröninger, Albersdorf (DE); Manfred Schneegans, Vaterstetten (DE)

(73) Assignee: Infineon Technologies AG, Neubiberg (DE)

(21) Appl. No.: 12/798,150

(22) Filed: Mar. 29, 2010

Related U.S. Patent Documents

Reissue of:
(64) Patent No.: 7,351,514
Issued: Apr. 1, 2008
Appl. No.: 11/156,405
Filed: Jun. 20, 2005

U.S. Applications:
(63) Continuation of application No. PCT/EP03/14460, filed on Dec. 18, 2003.

(30) Foreign Application Priority Data

Dec. 20, 2002 (DE) ..... 102 60 235

(51) Int. Cl.
*G03C 11/12* (2006.01)
*G03F 7/34* (2006.01)
*G03F 7/42* (2006.01)
*G03F 7/16* (2006.01)

(52) U.S. Cl. ..... 430/258; 430/260; 430/329

(58) Field of Classification Search ..... 430/258, 430/260, 329
See application file for complete search history.

(56) References Cited

U.S. PATENT DOCUMENTS

| | | | |
|---|---|---|---|
| 3,469,982 | A | 9/1969 | Celeste |
| 3,683,060 | A | 8/1972 | Tanabe et al. |
| 3,961,961 | A | 6/1976 | Rich |
| 4,050,936 | A | 9/1977 | Takeda et al. |
| 4,211,560 | A | 7/1980 | Taguchi et al. |
| 4,289,841 | A | 9/1981 | Cohen et al. |
| 4,318,975 | A | 3/1982 | Kuznetsov et al. |
| 4,323,637 | A | 4/1982 | Chen et al. |
| 4,349,620 | A | 9/1982 | Cyr et al. |
| 4,357,413 | A | 11/1982 | Cohen et al. |
| 4,528,261 | A | 7/1985 | Hauser |
| 4,571,374 | A | 2/1986 | Vikesland |
| 4,649,100 | A | 3/1987 | Leyrer et al. |
| 4,652,513 | A | 3/1987 | Pentak et al. |
| 4,698,294 | A | 10/1987 | Lau et al. |
| 4,826,705 | A | 5/1989 | Drain et al. |
| 5,015,059 | A | 5/1991 | Booth et al. |
| 5,049,623 | A | 9/1991 | Dupont |
| 5,077,174 | A | 12/1991 | Bauer et al. |
| 5,106,450 | A | 4/1992 | Freisitzer et al. |

(Continued)

FOREIGN PATENT DOCUMENTS

EP 0431 637 A1 6/1991

(Continued)

OTHER PUBLICATIONS

German Office Action Dated Jul. 2, 2009 and English Translation.

(Continued)

*Primary Examiner* — Amanda C. Walke

(57) ABSTRACT

A method in which a resist layer is applied to a base layer is disclosed. The resist layer includes an adhesive material, and the adhesive force of the adhesive material decreases or increases during an irradiation process. Residues of the resist layer may be stripped using the disclosed method.

29 Claims, 2 Drawing Sheets

U.S. PATENT DOCUMENTS

| | | | |
|---|---|---|---|
| 5,239,029 | A | 8/1993 | Yaguchi |
| 5,242,756 | A | 9/1993 | Hensel et al. |
| 5,378,298 | A | 1/1995 | Williams et al. |
| 5,378,583 | A | 1/1995 | Guckel et al. |
| 5,759,336 | A | 6/1998 | Yamamoto et al. |
| 5,959,011 | A | 9/1999 | Mizuno et al. |
| 6,040,110 | A | 3/2000 | Shirai et al. |
| 6,100,006 | A | 8/2000 | Taylor, Jr. et al. |
| 6,465,092 | B1 | 10/2002 | Takushima et al. |
| 6,842,288 | B1 | 1/2005 | Liu et al. |
| 7,005,176 | B2 | 2/2006 | Tojo et al. |
| 2003/0091926 | A1 | 5/2003 | Shelnut |

FOREIGN PATENT DOCUMENTS

| | | | |
|---|---|---|---|
| EP | 0 553 638 | A1 | 8/1993 |
| EP | 0 559 248 | A1 | 9/1993 |
| EP | 1 229 388 | A2 | 8/2002 |
| JP | 09147751 | A | 6/1997 |

OTHER PUBLICATIONS

S. Wolf, R.N. Tauber, *Silicon Processing for the VLSI Era. Volumne 1: Process Technology,* Sunset Beach, California, U.S.A., Lattice Press, 1986, S. 437-441. ISBN 0-961672-3-7.

F. Pedrotti, L. Pedrotti, W. Bausch, H. Schmidt, *Optik: eine Einführung, München,* London, Mexico, New York, Singapur, Sydney, Toronot: Prenitce Hall, 1996, S. 309-315. ISBN 3-8272-9510-6 with English Translation.

U.S. Appl. No. 11/943,145 Office Action Dated Mar. 20, 2009.

U.S. Appl. No. 11/943,145 Final Office Action Dated Oct. 15, 2009.

U.S. Appl. No. 11/943,145 Office Action Dated Jan. 27, 2010.

Final Office Action for U.S. Appl. No. 11/943,145, Dated Jun. 23, 2010.

Notice of Allowance for U.S. Appl. No. 11/943,145, Dated Apr. 11, 2010.

METHOD FOR APPLYING A RESIST LAYER, USES OF ADHESIVE MATERIALS, AND ADHESIVE MATERIALS AND RESIST LAYER

Matter enclosed in heavy brackets [ ] appears in the original patent but forms no part of this reissue specification; matter printed in italics indicates the additions made by reissue.

PRIORITY AND CROSS REFERENCE TO RELATED APPLICATION

This application is *a reissue of U.S. Pat. No. 7,351,514, issued Apr. 1, 2008, entitled "METHOD FOR APPLYING A RESIST LAYER, USES OF ADHESIVE MATERIALS, AND ADHESIVE MATERIALS AND RESIST LAYER.", which is* a continuation of International Application No. PCT/EP2003/014460 filed Dec. 18, 2003, which claims priority to German application 102 60 235.2 filed Dec. 20, 2002, [both] *all* of which are incorporated herein in their entirety by reference.

BACKGROUND

1. Field of the Invention

The present invention relates to the field of resist layers, and more particularly, it relates to a method for applying a resist layer to a base layer, selectively irradiated and developed.

2. Description of the Related Art

Methods have been used in the context of a lithography process for patterning a base layer after the development of a resist layer and in the context of a galvanic method in which contact areas are deposited on connecting pads in the base layer. A photoresist that is spun onto the base layer in the liquid state has hitherto been used as the resist layer. After evaporation or baking out of a solvent contained in the photoresist, the resist cures and is then exposed. During the spinning-on process, fluctuations arise in the thickness of the photoresist layer produced. Moreover, the removal of residues of the photoresist layer after the development may be complicated. By way of example, it may be necessary to use a solvent whose disposal is cost intensive. The spun on resist layers are usually thinner than 30 μm (micrometers). If thicker resist layers are intended to be produced, then the spinning on process is repeated appropriately often after the curing of a previously applied resist layer.

BRIEF SUMMARY OF THE INVENTION

By way of introduction only, a method for a method for applying a resist layer to a base layer, selectively irradiated and developed is described.

An exemplary embodiment of the present invention specifies a simple method for the application of a resist layer, and uses of adhesive materials and a resist layer that are used in such a method. The resist layer is applied, in particular adhesively bonded, to the base layer in the solid state. The resist layer may be fabricated on a planar support with a very uniform layer thickness such as in continuous production.

The resist layer can be fixed to the base layer if, directly before the application of the resist layer, an adhesive material is applied to the base layer and/or to the resist layer, such as by being sprayed on or spread on. Alternatively, in a variant that is cleaner in terms of production technology with regard to adhesive residues, a resist layer is used that is adhesive or is coated with an adhesive layer already long before the application to the base layer.

Many of the materials used in resist layers are suitable as irradiation sensitive materials in the resist layer, such as diazonaphthoquinone or naphthoquinonediazide in the case of positive resist and partially cyclized polyisopropene in the case of negative resist. The resist layer additionally may include a suitable film former, such as phenolic resin compounds. Additives in the resist layer may be, inter alia, stabilizers and/or inhibitors.

An exemplary method enables complete utilization of liquid resist material used during the production of the resist film. Only 10% of the resist liquid is used during the conventional spinning on process and the remaining 90% cannot be used on account of oxidation processes.

A development is based, at least in part, on the consideration that the selection of the resist layer material and also the exposure of the resist layer should already be performed taking account of the later stripping operation. The fact that there are adhesives that vary their adhesive force upon the action of an irradiation may also be considered. By way of example, the irradiation produces polymers or copolymers from monomers or from oligomers, a crosslinking that occurs in this case leading to a reduction of the adhesive force. On the other hand, polymers or copolymers can also be split into monomers or oligomers by an irradiation, the adhesive force being increased. Another class of adhesives contains substances that decompose the adhesive and can be activated or deactivated by an irradiation. Regions of the resist layer or of the adhesive layer that are crosslinked to different extents are stripped at different speeds by solvents, so that the resist layer can be developed in a simple manner.

A resist layer that initially has a lower adhesive force may be used for example for a so called positive resist. During exposure, polymers are split up, as a result of which although the adhesive force rises in the exposed region, these regions can be removed more easily by a solvent than the unexposed regions.

A material having an originally high adhesive force may be used in the case of a negative resist. The exposed regions are crosslinked, for example, during exposure, so that the adhesive force is reduced in these regions. During development, only the unexposed regions are removed, i.e. the regions that are not yet crosslinked. Therefore, in one development, use is made of a resist layer made of an adhesive whose adhesive force decreases or increases during the irradiation. This results in a simple method in which regions which remain on the base layer after the development can be removed in a simple manner. On account of the originally low adhesive force or the adhesive force that is reduced during the irradiation, these regions can be removed in a simple manner for example by using a stripping adhesive tape, in particular without the use of additional solvents or with a reduced solvent quantity.

In another development which relates to negative resists, the adhesive force decreases during an irradiation by more than 30% or by more than 50% or by more than 90% relative to the original adhesive force at the base layer. Fabrication specifications relate, for example, to the adhesive force at silicon wafers or at polyimide wafers. The original adhesive force at silicon is, for example, greater than 1 N/20 mm or even greater than 10 N/20 mm. After exposure, the adhesive force decreases e.g. to 0.16 N/20 mm. In particular, substances in the case of which the adhesive force decreases by more than 90% can also be fabricated in a simple manner. The adhesive force may increase by more than 50% or by more than 100%. Such substances can also be fabricated in a simple manner and are suitable in particular for positive resists.

In another development, the resist layer is irradiated or exposed with an electromagnetic radiation, preferably with an ultraviolet radiation or an X ray radiation. It is also possible to use particle beams, for example electron beams or ion beams for irradiation. The radiation serves for altering the adhesive force, by specific chemical alterations being brought about by the radiation, for example a polymerization or a splitting of polymers.

In another development, regions of the resist layer that remain on the layer to be patterned after the development have a reduced adhesive force in comparison with the non-irradiated resist layer. The reduced adhesive force facilitates the later removal of the residual regions. If a contiguous region is involved, the residual resist layer can be stripped in a simple manner such as with the use of pincers.

In another development, the residual regions may be stripped with an adhesive area whose adhesive force is greater than the reduced adhesive force of the resist layer, preferably with an adhesive tape or an adhesive sheet. An adhesive tape or an adhesive sheet makes it possible for the stripping angle to be chosen freely within wide ranges and, if appropriate, also to be altered during the stripping process. The residual regions may be removed with a solvent. Removal with a solvent is simpler than heretofore because the adhesive force of the residual regions is greatly reduced, in particular in comparison with photoresists that are cured at the base layer.

In a next development of the method according to the invention, an organic solvent, in particular N methylpyrrolidone or dimethyl sulfoxide, is used as developer. The structural formula for dimethyl sulfoxide is $H_3C\ SO\ CH_3$. The developers mentioned may be used in the development of photoresist.

The resist layer may also be applied with an adhesive area whose adhesive force is less than the adhesive force of the nonirradiated layer at the base layer. In one refinement, an adhesive tape or an adhesive sheet is used. Such an application of the resist layer may be carried out without adhesive residues arising at the machines or tools used for the application. As an alternative, by way of example, the resist layer can also be applied to the base layer by a method similar to screen printing.

In another development, use is made of a resist with an antireflection layer, making it possible to reduce the minimum feature sizes during the patterning of the resist layer, and thus, for example, also during the patterning of the base layer. Although the exemplary method is also used to produce structures with minimum dimensions of greater than 5 or 10 μm, the method may also be used if the minimum feature size is in the region of 1 μm or less.

The resist layer may have a thickness of greater than 30 μm, greater than 50 μm or even greater than 100 μm. Such a thick resist layer may be applied in an application operation. When using photoresist, a plurality of application operations may be used, i.e. alternately spinning on, curing, spinning off, etc. The method for the application of the resist layer is thus substantially simplified by the development.

In another development, the base layer is patterned in accordance with the regions of the resist layer which remain after the development, preferably in a dry etching process or in a wet chemical etching process. As an alternative, material is applied between the remaining regions of the resist layer on the base layer, preferably by a galvanic, by a chemical or chemical physical deposition, for example with the aid of a sputtering method.

In a further aspect, the invention additionally relates to the use of an adhesive agent whose adhesive force changes during an irradiation, for the selective patterning of a layer or for the selective application of material to a layer. The use of an adhesive tape or an adhesive sheet with such an adhesive agent for the selective patterning of a layer or for the selective application of material to a layer is additionally protected.

A further aspect protects the use of an adhesive tape or an adhesive sheet for the removal of residues of a resist layer, in particular of a resist layer which has been patterned according to the method according to the invention or one of its developments.

The invention additionally relates to an adhesive tape or an adhesive sheet that includes an adhesive layer whose adhesive force changes during an irradiation. Moreover, the adhesive tape or the adhesive sheet contains an outer layer on one side of the adhesive layer, which outer layer can be removed from the adhesive layer with a low expenditure of force in comparison with the adhesive force of the adhesive layer at the base layer. By way of example, the adhesion force is less than 0.5 N/20 mm (Newton per 20 millimeters). This means that a force of 0.5 Newton is required for stripping the outer layer from an adhesive layer having a width of 20 mm. Thus, the required force amounts to, for example, only 50% or even only 10% of the adhesive force with which the adhesive layer adheres to the base layer. A further outer layer is arranged on the other side of the adhesive layer, and can likewise be stripped with a small force. Such an adhesive tape is suitable for the simple application of the adhesive layer to the base layer. Thus, firstly one outer layer is removed. Afterward, the adhesive tape or the adhesive sheet is adhesively bonded to the base layer and the other outer layer is then removed. The method according to the invention or one of its developments is subsequently carried out.

In another development, the further outer layer is formed by an outer layer of another section of the same outer layer of a rolled up adhesive tape or by an outer side of another adhesive sheet of an adhesive sheet stack having at least two adhesive sheets. As a result, the outer layers may be utilized multiply, namely for covering in each case two adhesive layers or in each case two sections of an adhesive layer.

The invention additionally relates to an adhesive tape or an adhesive sheet that includes an adhesive layer whose adhesive force changes during an irradiation. The adhesive tape or adhesive sheet contains at least one antireflection layer, which prevents or reduces a reflection of the radiation. The use of an antireflection layer makes it possible to reduce the minimum feature sizes during the patterning of the adhesive layer.

In another development, the antireflection layer is arranged in the center of the adhesive layer or at the edge of the adhesive layer. The antireflection layer has, by way of example, a different refractive index than the rest of the adhesive layer. As an alternative or in addition, the absorption coefficient for the radiation is greater in the antireflection layer than in the adhesive layer.

The adhesive materials mentioned are used, in particular, in the method according to the invention or one of its developments.

BRIEF DESCRIPTION OF THE DRAWINGS

Exemplary embodiments of the invention are explained below with reference to the accompanying drawings, in which.

DETAILED DESCRIPTION OF THE PREFERRED EMBODIMENTS

A method for applying a resist layer to a base layer, selectively irradiated and developed will now be described more fully with reference to the accompanying drawings. In each of the following figures, components, features and integral parts that correspond to one another each have the same reference number. The drawings of the figures are not true to scale.

Figure 1:
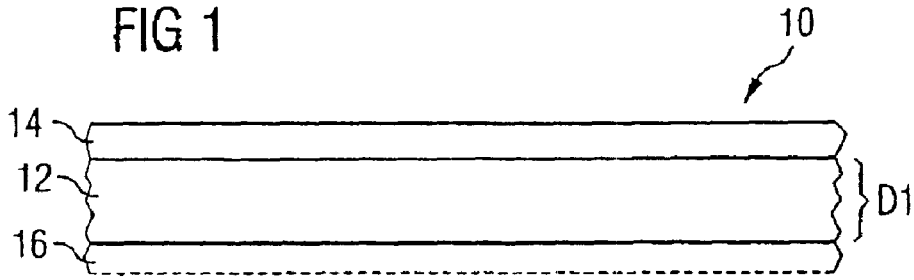
FIG. 1 shows an adhesive tape.

FIG. 1 shows an adhesive tape 10 having an adhesive layer 12 and an outer layer 14. The adhesive layer 12 includes a substance with an adhesive force that may be reduced by irradiation with ultraviolet light. During the fabrication of the adhesive tape 10, the adhesive force of the adhesive layer 12 on a silicon wafer is 2.0 N/20 mm, for example. The thickness of the adhesive layer 12 is 50 μm in the exemplary embodiment. One example of the composition of the adhesive layer 12 will be explained in more detail further below.

The outer layer 14 is composed, for example, of PET or PETP (polyethylene terephthalate), i.e. of polyethylene, or of another suitable plastic. The outer layer 14 can be stripped easily from the adhesive layer 12. The adhesive tape 10 is rolled up on a roll, so that the outer layer 14 encloses the adhesive layer 12 from both sides.

In another exemplary embodiment, the adhesive tape 10 also includes, in addition to the adhesive layer 12 and the outer layer 14, an antireflection layer 16 having a similar composition to the adhesive layer 12. The antireflection layer 16 also includes particles that increase the absorption of ultraviolet radiation in the antireflection layer 16.

Figure 2A:
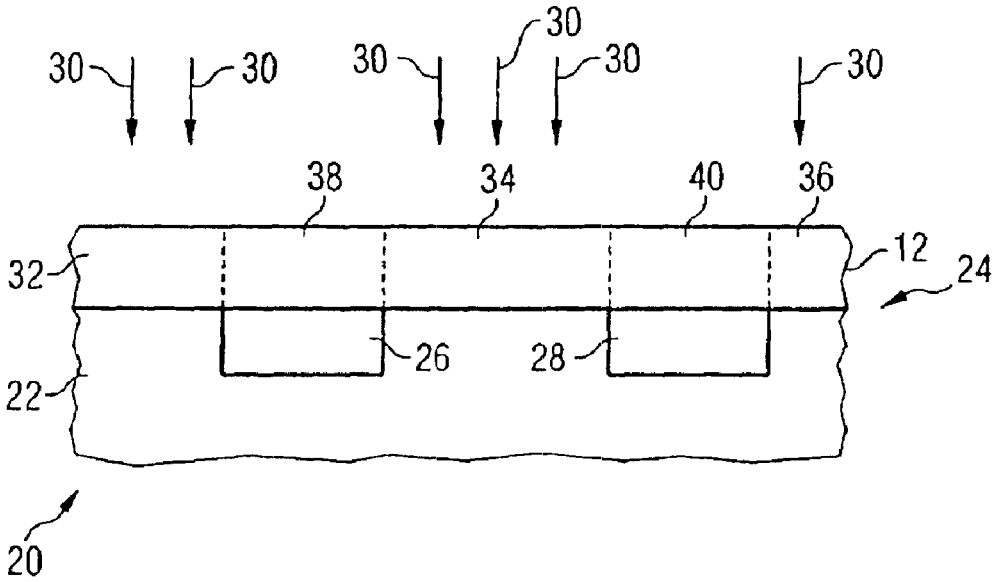
FIGS. 2A and 2B show a patterning of a resist layer on an integrated circuit arrangement and a galvanic deposition.

FIG. 2A shows an integrated circuit arrangement 20 having integrated components (not illustrated) e.g. transistors. The integrated circuit arrangement 20 also includes an oxide layer 22, such as a silicon dioxide layer. Situated in the oxide layer 22 is a metallization layer 24 that includes multiple copper interconnects, of which two copper interconnects 26 and 28 are illustrated in FIG. 2A. Barrier layers are not depicted in FIG. 2A for the sake of clarity of the illustration.

After a chemical mechanical polishing (CMP) and a cleaning method are performed, the adhesive tape 10 is adhesively bonded to the integrated circuit arrangement 10. The outer layer 14 is subsequently stripped, for example, manually with pincers or with a stripping adhesive tape and a stripping machine.

A selective exposure is then carried out using a photomask. Arrows 30 symbolize an impinging ultraviolet light. The exposure results in exposed regions 32 to 36 in the adhesive layer 12. The exposed regions 32 to 36 lie above the interspaces between the copper interconnects 26 and 28 and delimit unexposed regions 38, 40 lying above the copper interconnect 26 or 28, respectively. In the exposed region 32 to 36, strongly crosslinked polymers form as a result of the exposure. The polymers reduce the adhesive force of the adhesive layer 12 in the exposed regions 32 to 36. In the unexposed regions 38 and 40, comparatively weakly crosslinked or short polymers are present, so that the adhesive force remains high without any change.

Figure 2B:
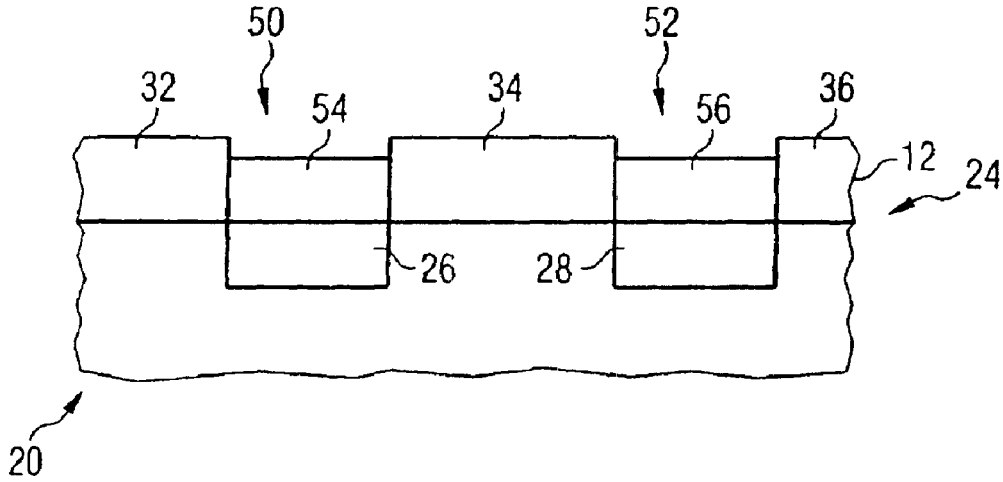

As illustrated in FIG. 2B, a development operation is subsequently formed with the aid of a solvent which strips the regions that are crosslinked to a lesser extent, i.e. the unexposed regions 38 and 40, to a greater extent than the exposed regions 32 to 36. Therefore, during development, the unexposed regions 36 and 40 of the adhesive layer 12 are removed, so that cutouts 50 and 52 are produced in their place. The bottoms of the cutouts 50 and 52 reach as far as the copper interconnect 26 and 28, respectively. Copper contacts 54 and 56 are deposited in the cutout 50 and in the cutout 52, respectively. The copper contacts 54 and 56 may be deposited using a galvanic method, such as a galvanic method using external current, or a galvanic method free of external current.

In another exemplary embodiment, an adhesive agent 12 that works as a positive resist is used. In this case, the adhesive agent 12 originally has a low adhesive force. During the exposure, the regions 38 and 40 are exposed. In these regions, polymers are split up as a result of the exposure. At the same time, the adhesive force increases in these regions. During development, the regions 38 and 40 are again removed and the further method is also as explained above with reference to FIG. 2B.

In the methods explained with reference to FIGS. 2A and 2B, after the electrodeposition, a stripping adhesive tape is applied to the adhesive layer 12 and subsequently stripped away. During the stripping away process, the residual regions 32 to 36 remain attached to the stripping adhesive tape and are removed from the integrated circuit arrangement 20.

Figure 3A:
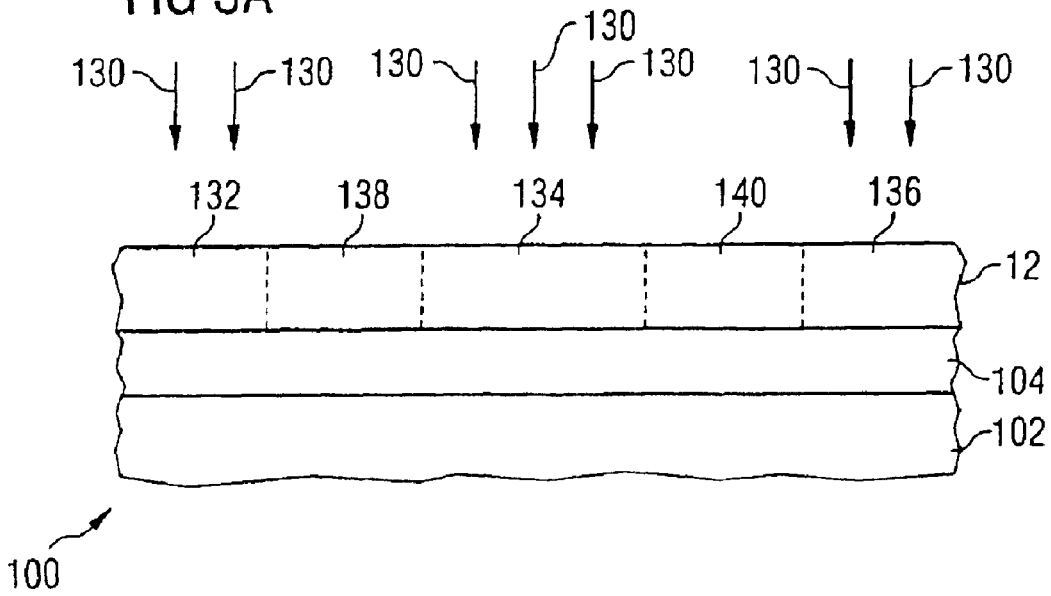
FIGS. 3A, 3B and 3C show a patterning of a resist layer on an integrated circuit arrangement and the subsequent patterning of a layer.

As illustrated in FIG. 3A, the adhesive tape 10 can also be used for patterning a layer. An integrated circuit arrangement 100 contains an oxide layer 102, such as a silicon dioxide layer or a BPSG layer (borophosphosilicate glass). A metal layer 104 to be patterned is situated on the oxide layer 102, where the metal layer includes an aluminum or an aluminum alloy in small amounts of less than 5% by weight in the exemplary embodiment.

The adhesive tape 10 is adhesively bonded to the metal layer 104. The outer layer 14 is subsequently stripped away to leave only the adhesive layer 12 or the adhesive layer and the antireflection layer 16 on the metal layer 104. The adhesive layer 12 is then selectively exposed with the aid of a photomask, see arrows 130, resulting in exposed regions 132 to 136 that delimit unexposed regions 138 and 140. In the exposed regions 132 to 136, the exposure leads to stronger crosslinking and to a reduction of the adhesive force of the adhesive layer 12 at the metal layer 104.

Figure 3B:
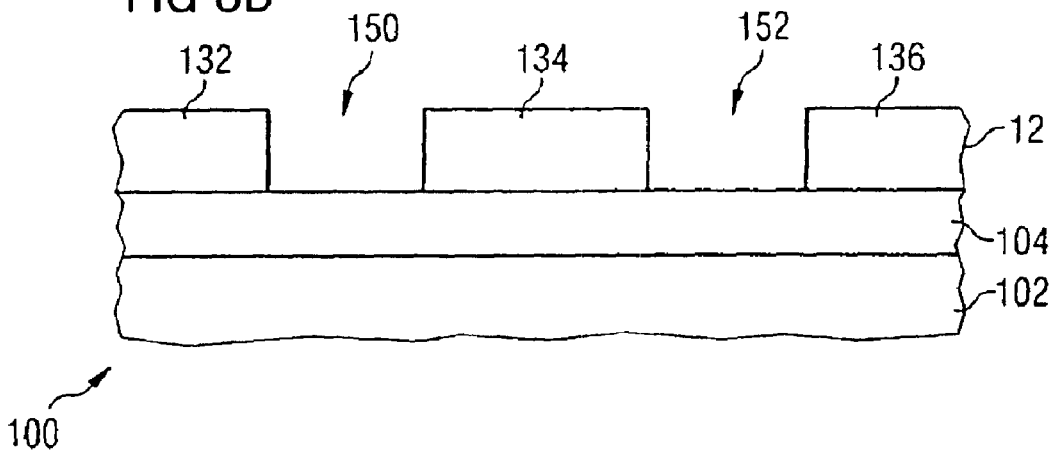

As illustrated in FIG. 3B, the adhesive layer 12 is subsequently developed with the aid of a solvent. This results in cutouts 150 and 152 between the exposed regions 132 to 136. The cutouts 150 and 152 lie at the places where the unexposed regions 138 and 140, respectively, were originally situated. The exposed regions 132 to 136 remain unchanged during the development.

Figure 3C:
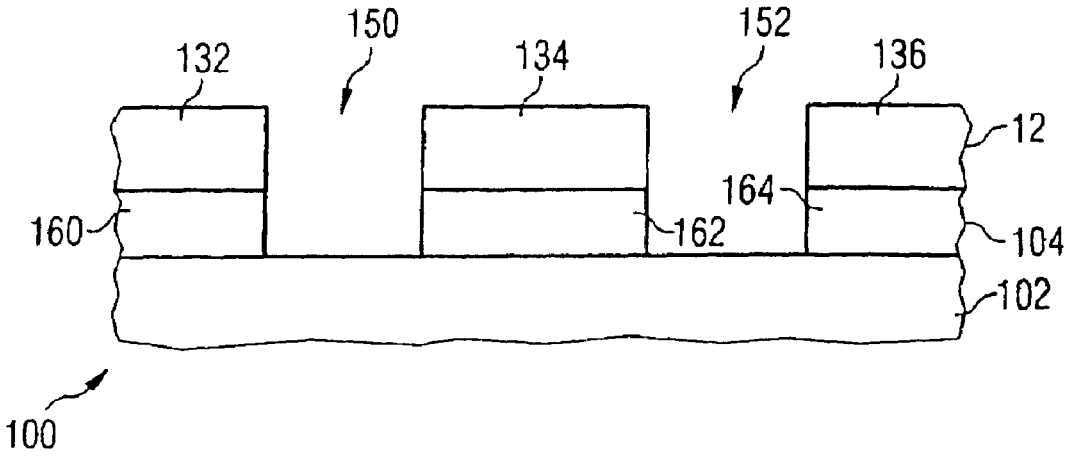

As illustrated in FIG. 3C, the metal layer 104 is subsequently patterned using an anisotropic etching process in accordance with the structure present in the adhesive layer 12. The cutouts 150 and 152 are extended through the metal layer 104. At the end of the etching process, the bottom of the cutout 150 lies on the oxide layer 102. The bottom of the cutout 152 likewise lies on the bottom of the oxide layer 102. Metal interconnects 160 to 164 are produced from the continuous metal layer 104 during the patterning.

After the etching process, the residual residues 132 to 136 of the adhesive layer 12 are removed with the aid of a stripping adhesive tape, such as in the manner explained above with reference to FIG. 2B.

In another exemplary embodiment, an adhesive layer 12 which acts as a positive resist is likewise used for the method explained with reference to FIGS. 3A to 3C. Reference is made to the explanations concerning FIGS. 2A and 2B in connection with a positive resist.

In one exemplary embodiment, the adhesive layer 12 includes a compound having a low molecular weight that has at least two photo-polymerizable carbon-carbon double bonds per molecule. The adhesive layer 12 may also include a photo-polymerization initiator. The photo-polymerizable compound has a number average molecular weight of about 10,000 or less, preferably of 5000 or less. The number of photo-polymerizable carbon-carbon double bonds per molecule should be 2 to 6, preferably 3 to 6. The photo-polymerizable compounds may be, for example, trimethylol-propane triacrylate, pentaerythritol triacrylate, pentaerythritol tetraacrylate, dipentaerythritol monohydroxypentaacrylate and dipentaerythritol hexa-acrylate. Other photo-polymerizable compounds which can be used include 1,4 butanediol diacrylate, 1,6 hexane diol diacrylate, polyethylene glycol diacrylate and commercially available oligoester acrylate.

The photo-polymerizable compounds may be used singly or in combinations. The quantity in which the photo-polymerizable compound is used lies in the range of 1 to 100 parts by weight relative to 100 parts by weight of the base polymer. If the quantity in which the photo-polymerizable compound is used is too small, the three dimensional network structure is formed only inadequately in the event of irradiation of the pressure sensitive adhesive layer 12 with light and the decrease in the adhesion force of the thin adhesive layer 12 at the integrated circuit arrangement 20 is too small. On the other hand, if their quantity is too large, the plasticity of the resulting pressure-sensitive adhesive layer increases significantly and the original adhesive force rises excessively. Examples of photo-polymerizable initiators are: isopropyl benzoin ether, isobutyl benzoin ether, benzophenone, Michler's ketone, chlorothioxanthone, dodecylthioxanthone, dime thylthioxanthone, diethylthioxanthone, acetophenone diethyl ketal, benzyl dimethyl ketal, α-hydroxyl-cyclohexyl phenyl ketone and 2-hydroxymethylphenyl propane. These compounds may be used singly or in combinations.

Use was made of a composition comprising 100 parts of butylacrylate, 5 parts of acrylonitrile and 5 parts of acrylic acid for a copolymerization in toluene in order to prepare an acrylic copolymer having a number average molecular weight of 300,000. The following were added to 100 parts of the acrylic copolymer: 5 parts of a polyisocyanate compound (trade name "Coronate L", prepared by the company Nippon Polyurethane Co. Ltd.), 15 parts of dipentaerythritol monohydroxypentaacrylate and 1 part of a hydroxycyclo-hexyl phenyl ketone. These parts were mixed to produce the adhesive layer 12. The composition was applied in the form of a layer to the surface of the outer layer 14 with a thickness D1 of 50 μm and then dried for a period of time at an elevated temperature, such as for 3 minutes, at 130° C.

In another exemplary embodiment, an acrylic copolymer having a number average molecular weight of 3000 or of 30,000 is prepared, to which the abovementioned parts are then added. Other known compositions can also be used instead of the compositions explained for the adhesive layer 12. In particular, a uniform thickness of the resist layer may be achieved by means of the methods specified above. Thickness tolerances of less than +/−3% may be achieved in a simple manner.

In specific wafer processing operations, the slice edge is not given a resist coating, in order to ensure the problem free transporting and introduction of the wafers in machines or a current connection in a galvanic method. Removing the edge with a solvent that is only sprayed on at the edge would increase the resist thickness at the slice edge by up to 15 percent on account of unavoidable introduction of solvent also into the resist that is not to be removed.

Steps for additionally removing a peripheral edge region are avoided if the tape type or sheet type resist layer is prestamped (precut) to a size which is at least 2 mm or at least 5 mm smaller than the wafer diameter. A centering step is performed in this case. Such a centering step may be performed if films with the contour of the wafer are used. If a wafer flat is taken into account on the prestamped or preformed film, then the correct position of the flat region must also be taken into consideration when applying the resist film.

However, unstamped tapes or sheets are also used, a matching resist piece being cut out by means of a cutting edge after the application of the film, such as from a roll, along the wafer edge. Centering operations may be obviated in this case.

Tape lamination processes are additionally considerably quicker and less expensive than resist coating processes. The exposure can be performed by means of mask aligner systems. The antireflection properties of the films make it possible also to pattern metal interconnects over topographies without constrictions.

A radiation-sensitive component, such as a UV-light-sensitive component (ultraviolet), in the resist and/or in the adhesive enables residue free removal from the slice surface, in particular without tears. If the resist cures further during the irradiation, then it becomes more resistant to plasma attacks. The use of thermostable components in the resist makes it possible to further increase the plasma power during the patterning of a layer lying below the resist.

It is therefore intended that the foregoing detailed description be regarded as illustrative rather than limiting, and that it be understood that it is the following claims, including all equivalents, that are intended to define the spirit and scope of this invention.

What is claimed is:

1. A method for the application of a resist layer, comprising:

applying a resist layer to a base layer;

selectively irradiating the resist layer; and developing the resist layer, wherein the resist layer is applied to the base layer in the solid state; and wherein a matching resist piece is cut out along an edge of a wafer after the application of the resist layer.

2. The method of claim 1, further comprising covering the resist layer with a protective material before the application of the resist layer to the base layer, the protective material preventing a curing of an adhesive associated with the resist layer, and being removed before the application.

3. The method of claim 2, where the protective material is arranged at the resist layer.

4. The method of claim 2, where the protective material is removed less than 10 minutes before the application to the base layer.

5. The method of claim 2, wherein the base layer comprises a semiconductor substrate.

6. The method of claim 2, comprising irradiating the resist layer with any one of electromagnetic radiation, ultraviolet radiation, X ray radiation, particle radiation, electron radiation, and ion radiation.

7. A method for patterning a resist layer, comprising:

applying resist layer to a base layer;

selectively irradiating the resist layer; and developing the resist layer;

wherein the resist layer is bonded to the base layer in the solid state and comprises an adhesive whose adhesive force changes with respect to the adhesive force at the base area during the irradiation; and providing an antireflection layer with the resist layer before the application of the resist layer to the base layer, said antireflection layer preventing a reflection of the radiation at the resist layer.

8. The method of claim 7, wherein the adhesive force decreases by more than 30% during irradiation.

9. The method of claim 8, wherein the adhesive force decreases by more than 90% during irradiation.

10. The method of claim 7, wherein the adhesive force increases by more than 50% during irradiation.

11. The method of claim 10, wherein the adhesive force increases by more than 100% during irradiation.

12. The method of claim 7, wherein remaining regions of the resist layer on the base layer after the development have a reduced adhesive force in comparison with the nonirradiated resist layer.

13. The method of claim 7, comprising stripping remaining regions of the resist layer on the base layer after the development with an adhesive area having an adhesive force at the remaining regions being greater than the adhesive force of the remaining regions with respect to the base layer.

14. The method of claim 7, comprising removing remaining regions of the resist layer on the base layer after the development with a solvent.

15. The method of claim 7, comprising using an organic solvent as a developer.

16. A method for patterning a resist layer, comprising:

applying a resist layer to a base layer;

selectively irradiating the resist layer; and developing the resist layer;

wherein the resist layer is bonded to the base layer in the solid state and comprises an adhesive whose adhesive force changes with respect to the adhesive force at the base area during the irradiation comprising using an organic solvent as a developer; and where the organic solvent comprises N methylpyrrolidone.

17. A method for patterning a resist later, comprising:

applying a resist layer to a base layer;

selectively irradiating the resist layer; and developing the resist layer;

wherein the resist layer is bonded to the base layer in the solid state and comprises an adhesive whose adhesive force changes with respect to the adhesive force at the base area during the irradiation comprising using an organic solvent as a developer; and where the organic solvent comprises dimethyl sulfoxide.

18. The method of claim 7, comprising applying the resist layer using an auxiliary area that adheres to the resist layer with a smaller adhesive force than the adhesive force of the nonirradiated resist layer at the base layer.

19. The method of claim 18, comprising applying the resist layer using an auxiliary tape.

20. The method of claim 18, comprising applying the resist layer using an auxiliary sheet.

21. A method for the application of a resist layer, comprising:

applying a resist layer to a base layer;

selectively irradiating the resist layer; and developing the resist layer[.], wherein the resist layer is applied to the base layer in the solid state; and wherein the resist layer is formed on a wafer and prestamped to a size which is at least 2 mm smaller than a diameter of the wafer.

22. A method for patterning a resist layer, comprising:

applying a resist layer to a base layer;

selectively irradiating the resist layer; and developing the resist layer;

wherein the resist layer is bonded to the base layer in the solid state and comprises an adhesive whose adhesive force changes with respect to the adhesive force at the base area during the irradiation; and providing an antireflection layer with the resist layer before the application of the resist layer to the base layer, said antireflection layer reducing a reflection of the radiation at the resist layer.

23. The method of claim 7, comprising applying a resist layer with a thickness of greater than 30 μm in an application operation.

24. The method of claim 23, comprising applying a resist layer with a thickness of greater than 100 μm in an application operation.

25. The method of claim 7, comprising patterning the base layer in accordance with the regions of the resist layer that remain after the development.

26. The method of claim 25, comprising patterning the base layer in accordance with the regions of the resist layer that remain after the development in an etching method.

27. The method of claim 7, comprising applying material to uncovered regions of the base layer that are arranged between remaining regions of the resist layer after the development.

28. The method of claim 27, comprising applying material to uncovered regions of the base layer that are arranged between remaining regions of the resist layer after the development by means of any one of galvanic, chemical or chemical physical and physical application.

29. The method of claim 7, comprising doping the base layer selectively in accordance with the regions of the resist layer which remain after the development.

* * * * *